(12) United States Patent
Hitsuoka

(10) Patent No.: US 10,966,324 B2
(45) Date of Patent: Mar. 30, 2021

(54) WIRING BOARD, MULTILAYER WIRING BOARD, AND METHOD OF MANUFACTURING WIRING BOARD

(71) Applicant: TOPPAN PRINTING CO., LTD., Tokyo (JP)

(72) Inventor: Yasuyuki Hitsuoka, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 0 days.

(21) Appl. No.: 16/439,326

(22) Filed: Jun. 12, 2019

(65) Prior Publication Data
US 2019/0297731 A1 Sep. 26, 2019

Related U.S. Application Data

(63) Continuation of application No. PCT/JP2017/044091, filed on Dec. 7, 2017.

(30) Foreign Application Priority Data

Dec. 15, 2016 (JP) .............................. JP2016-243664

(51) Int. Cl.
*H05K 1/00* (2006.01)
*H05K 1/02* (2006.01)
(Continued)

(52) U.S. Cl.
CPC .............. *H05K 3/108* (2013.01); *H05K 1/11* (2013.01); *H05K 1/116* (2013.01); *H05K 3/064* (2013.01);
(Continued)

(58) Field of Classification Search
CPC .. H05K 1/00; H05K 1/02; H05K 1/03; H05K 1/09; H05K 1/11; H05K 1/18; H05K 3/00;
(Continued)

(56) References Cited

U.S. PATENT DOCUMENTS 4,135,988 A * 1/1979 Dugan ..................... C25D 5/02
174/263
5,258,094 A * 11/1993 Furui ................... H05K 3/4614
216/18
(Continued)

FOREIGN PATENT DOCUMENTS

EP 1 662 850 A 5/2006
JP 2006-294956 A 10/2006
(Continued)

OTHER PUBLICATIONS

International Searching Authority, "International Search Report," issued in connection with International Patent Application No. PCT/JP2017/044091, dated Feb. 27, 2018.
(Continued)

*Primary Examiner* — Xiaoliang Chen
(74) *Attorney, Agent, or Firm* — Foley & Lardner LLP

(57) ABSTRACT

A wiring board, a multilayer wiring board, and a method of manufacturing a wiring board adapted to make the filling of through holes and the formation of fine wiring patterns. The wiring board comprises an insulator; a through hole between front and back surfaces of the insulator; a through hole conductor for electrically connecting front and back surface side openings; through hole lands around the front and the back surface side openings, and connected to the through hole conductor; lid plating conductors on the front and the back surface sides, and placed on the respective through hole lands; and wiring patterns formed on the front are compatible and the back surface of the insulator. The thickness of the through hole lands is 1.0 μm or more and 10.0 μm or less, and the area of each lid plating conductor is less than the area of each through hole land.

7 Claims, 7 Drawing Sheets

(51) Int. Cl.

| | | |
|---|---|---|
| H05K 1/03 | (2006.01) | |
| H05K 1/09 | (2006.01) | |
| H05K 1/11 | (2006.01) | |
| H05K 1/18 | (2006.01) | |
| H05K 3/00 | (2006.01) | |
| H05K 3/02 | (2006.01) | |
| H05K 3/10 | (2006.01) | |
| H05K 3/16 | (2006.01) | |
| H05K 3/20 | (2006.01) | |
| H05K 3/30 | (2006.01) | |
| H05K 3/36 | (2006.01) | |
| H05K 3/38 | (2006.01) | |
| H05K 3/40 | (2006.01) | |
| H05K 3/42 | (2006.01) | |
| H05K 3/46 | (2006.01) | |
| H05K 3/06 | (2006.01) | |
| H05K 3/18 | (2006.01) | |

(52) U.S. Cl.
CPC ............. *H05K 3/067* (2013.01); *H05K 3/18* (2013.01); *H05K 3/42* (2013.01); *H05K 3/427* (2013.01); *H05K 3/46* (2013.01); H05K 3/0047 (2013.01); H05K 2203/0723 (2013.01); H05K 2203/1461 (2013.01)

(58) Field of Classification Search
CPC .. H05K 3/02; H05K 3/10; H05K 3/20; H05K 3/30; H05K 3/36; H05K 3/38; H05K 3/40; H05K 3/42; H05K 3/46; H05K 3/16
USPC ....... 174/262, 250, 251, 260, 263, 264, 266, 174/254–258; 29/740, 829, 830, 832, 852
See application file for complete search history.

(56) References Cited

U.S. PATENT DOCUMENTS

| | | | | |
|---|---|---|---|---|
| 5,609,704 A * | 3/1997 | Hayama | ............... | B82Y 30/00 156/230 |
| 6,237,218 B1 * | 5/2001 | Ogawa | ............... | H05K 3/4638 174/254 |
| 6,329,610 B1 * | 12/2001 | Takubo | ............... | H01L 23/49827 174/264 |
| 6,426,011 B1 * | 7/2002 | Katoh | ............... | H05K 3/0094 216/105 |
| 6,465,745 B1 * | 10/2002 | Fontacha | ............... | H01L 23/49827 174/260 |
| 8,003,896 B2 * | 8/2011 | Wu | ............... | H05K 1/115 174/260 |
| 8,186,052 B2 * | 5/2012 | Iida | ............... | H05K 3/427 29/852 |
| 8,232,477 B2 * | 7/2012 | Kitamura | ............... | H05K 3/0094 174/255 |
| 8,726,495 B2 * | 5/2014 | Nakao | ............... | H05K 3/4617 29/831 |
| 9,107,314 B2 * | 8/2015 | Yoshimura | ............... | H05K 1/115 |
| 9,451,711 B2 * | 9/2016 | Hibino | ............... | H05K 3/429 |
| 10,433,432 B2 * | 10/2019 | Hassel | ............... | H05K 3/4084 |
| 2002/0046880 A1 * | 4/2002 | Takubo | ............... | H05K 3/4691 174/261 |
| 2003/0003617 A1 * | 1/2003 | Ikeda | ............... | H01L 23/5256 438/37 |
| 2004/0136152 A1 * | 7/2004 | Mitsuhashi | ............... | H05K 3/4602 174/262 |
| 2004/0226745 A1 * | 11/2004 | En | ............... | C25D 3/38 174/262 |
| 2005/0103520 A1 * | 5/2005 | Saiki | ............... | H05K 3/0035 174/250 |
| 2005/0126818 A1 * | 6/2005 | Kojima | ............... | H05K 3/4602 174/255 |
| 2005/0258522 A1 * | 11/2005 | En | ............... | H05K 3/4644 257/670 |
| 2006/0163740 A1 * | 7/2006 | Ohno | ............... | H01L 23/49833 257/762 |
| 2007/0124929 A1 * | 6/2007 | Ohsumi | ............... | H05K 3/0094 29/852 |
| 2007/0205520 A1 * | 9/2007 | Chou | ............... | H01L 24/48 257/780 |
| 2008/0164057 A1 * | 7/2008 | Mori | ............... | H05K 3/421 174/262 |
| 2008/0218985 A1 * | 9/2008 | Takeda | ............... | H05K 1/115 361/768 |
| 2008/0277155 A1 * | 11/2008 | Horiuchi | ............... | H05K 3/4602 174/264 |
| 2008/0314622 A1 | 12/2008 | Chang et al. | | |
| 2009/0098391 A1 * | 4/2009 | Nakagawa | ............... | H05K 1/036 428/433 |
| 2009/0288873 A1 * | 11/2009 | Horiuchi | ............... | H05K 1/116 174/262 |
| 2010/0051323 A1 * | 3/2010 | Yokouchi | ............... | B82Y 10/00 174/250 |
| 2011/0006322 A1 * | 1/2011 | Li | ............... | H01L 21/76898 257/98 |
| 2011/0016709 A1 * | 1/2011 | Mizutani | ............... | H05K 3/108 29/847 |
| 2011/0024167 A1 * | 2/2011 | Hashimoto | ............... | H05K 3/4605 174/258 |
| 2011/0079418 A1 * | 4/2011 | Furuichi | ............... | H01L 21/4846 174/257 |
| 2011/0110052 A1 * | 5/2011 | Ohmi | ............... | H05K 1/0265 361/748 |
| 2011/0114372 A1 * | 5/2011 | Kato | ............... | H05K 1/115 174/256 |
| 2011/0266671 A1 * | 11/2011 | Youm | ............... | H01L 23/49827 257/738 |
| 2011/0308848 A1 * | 12/2011 | Ito | ............... | H05K 3/465 174/260 |
| 2012/0043123 A1 * | 2/2012 | Takada | ............... | H05K 3/4602 174/258 |
| 2012/0153463 A1 * | 6/2012 | Maeda | ............... | H01L 23/49822 257/737 |
| 2012/0205142 A1 * | 8/2012 | Higo | ............... | H05K 1/0242 174/251 |
| 2012/0241906 A1 * | 9/2012 | Nakanishi | ............... | H01L 23/49827 257/532 |
| 2013/0074332 A1 * | 3/2013 | Suzuki | ............... | H05K 3/4602 29/834 |
| 2013/0240259 A1 * | 9/2013 | Yoshimura | ............... | H05K 3/4608 174/266 |
| 2013/0285204 A1 * | 10/2013 | Saita | ............... | H05K 1/186 257/532 |
| 2014/0027165 A1 * | 1/2014 | Morita | ............... | H05K 1/024 174/258 |
| 2014/0225701 A1 * | 8/2014 | Morita | ............... | H01F 17/0013 336/200 |
| 2014/0311772 A1 * | 10/2014 | Mizutani | ............... | H05K 3/462 174/251 |
| 2015/0156881 A1 * | 6/2015 | Shimizu | ............... | H05K 1/185 174/255 |
| 2015/0189751 A1 * | 7/2015 | Akahoshi | ............... | H05K 3/427 174/262 |
| 2016/0278214 A1 * | 9/2016 | Hayashi | ............... | H01L 23/5386 |
| 2017/0013715 A1 * | 1/2017 | Hassel | ............... | H05K 1/115 |

FOREIGN PATENT DOCUMENTS

| | | |
|---|---|---|
| JP | 2009-252952 A | 10/2009 |
| JP | 2012-044081 A | 3/2012 |
| JP | 2013-131731 A | 7/2013 |
| JP | 5565951 B2 | 8/2014 |
| WO | WO-2005/022970 A1 | 3/2005 |

OTHER PUBLICATIONS

International Searching Authority, "Written Opinion," issued in connection with International Patent Application No. PCT/JP2017/044091, dated Feb. 27, 2018.

(56) References Cited

OTHER PUBLICATIONS

Extended European Search Report dated Dec. 4, 2019 for corresponding Application No. 17881483.6.

* cited by examiner

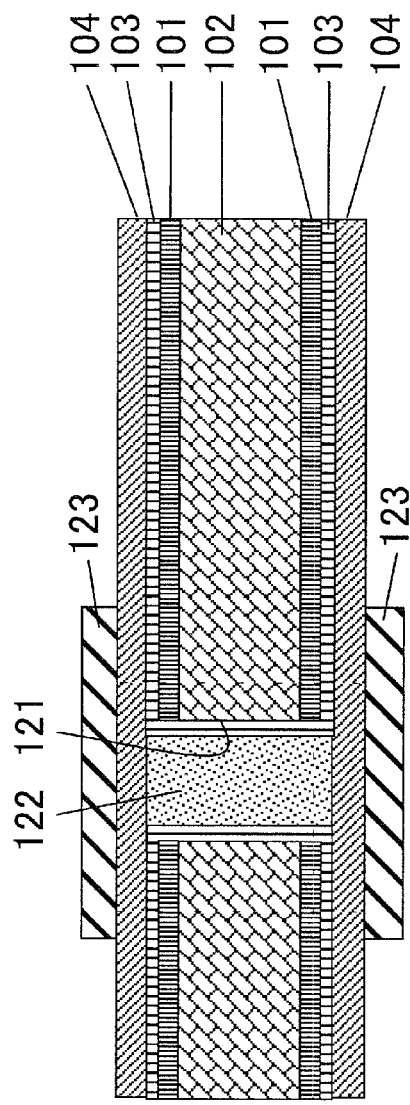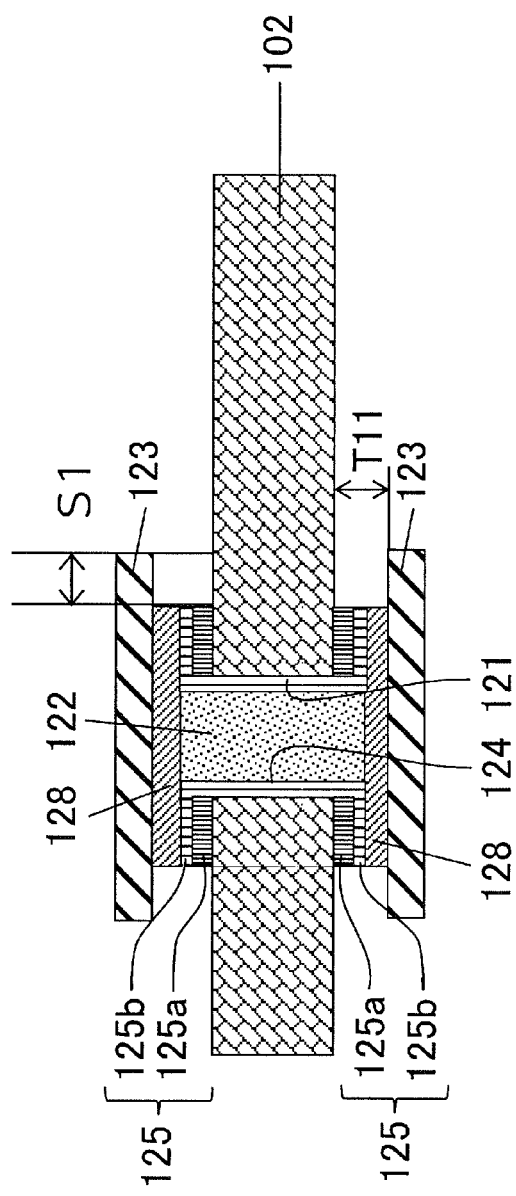
FIG. 6A
FIG. 6B

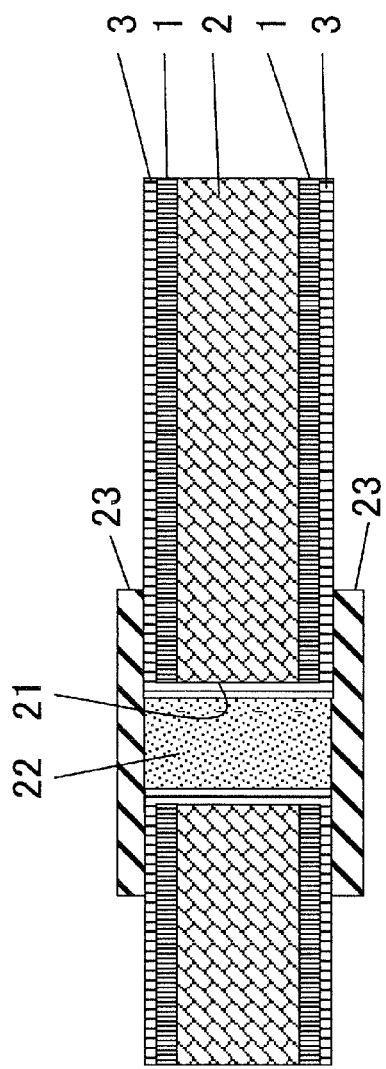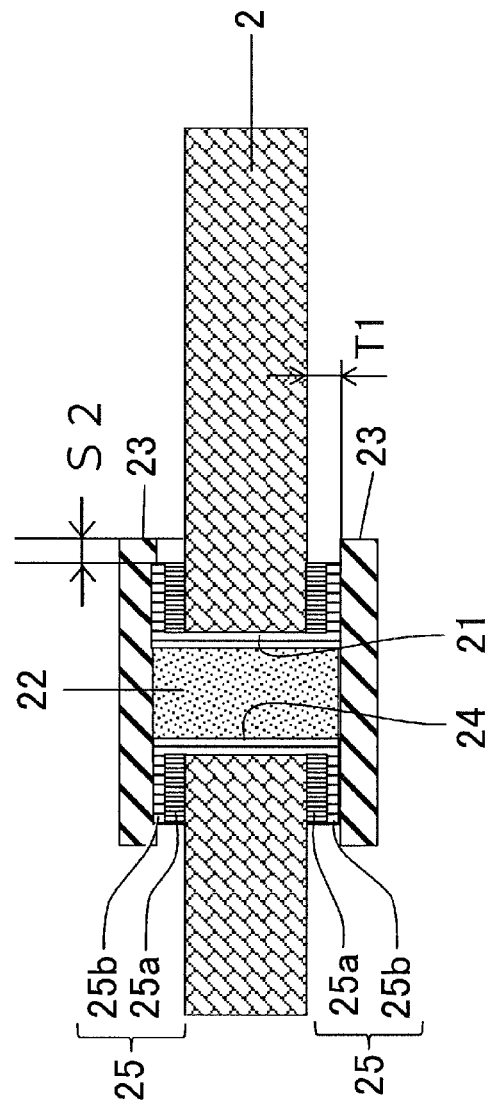

WIRING BOARD, MULTILAYER WIRING BOARD, AND METHOD OF MANUFACTURING WIRING BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2017/044091, filed on Dec. 7, 2017, which is based upon and claims the benefit of priority to Japanese Patent Application No. 2016-243664, filed on Dec. 15, 2016; the disclosures of which are incorporated herein by reference in their entireties.

TECHNICAL FIELD

The present invention relates to a wiring board, a multilayer wiring board, and a method of manufacturing a wiring board.

BACKGROUND ART

A popular conventional method of manufacturing a multilayer printed wiring board employs the build-up method in which conductor layers (wiring layers) provided with wiring and insulating layers (interlayer insulating layers) are alternately stacked. The interlayer conduction and wiring formation in the build-up method are generally performed by forming through holes with a mechanical drill, plating the inner walls of the through holes, performing resin filling, performing lid plating if necessary, and then performing a subtractive method.

In recent years, along with the miniaturization and improvement in performance of electronic devices, finer and more accurate conductor wiring is also desired for the multilayer printed wiring boards which implement electronic components. Under such circumstances, techniques are proposed in which the formation of through holes and plating of the inner walls of the through holes are carried out in the same manner as in the conventional technique, and the wiring formation is performed by a semi-additive method (see PTLs 1 and 2). Semi-additive methods are capable of forming patterns that are finer than those of subtractive methods.

[Citation List] [Patent Literature] [PTL 1] WO 2005/022970; [PTL 2] JP 5565951 B.

SUMMARY OF THE INVENTION

Problem Desired to be Improved or Solved by the Invention

However, the conventional methods have the following problems.

That is, in the technique described in PTL 1, through holes are formed in a substrate made of an insulating layer, front and back conductivity is formed by plating, through hole lands are formed by the subtractive method, the through holes are filled with a thermosetting resin, and then lid plating and wiring formation are performed by the semi-additive method. A multilayer printed wiring board formed by this method has a structure that is difficult to be thinned since plated conductors that are generally thicker than 10 to 15 µm, generally 10 to 20 µm are formed on the front and back surfaces of the substrate. In addition, since the thickening of the conductors on the front and back surfaces of the substrate causes an increase in the amount of etching required for wiring formation in the subtractive method, the amount of undercut under the etching resist also increases, and thus formation of finer wiring is hindered.

Further, depending on the amount of curing shrinkage of the thermosetting resin filled in the through holes, the resin around the openings of the through holes may remain protruded or recessed as compared with the through hole lands. When via holes are to be formed over the through holes in the buildup layer formed thereon, this unevenness leads to bad via formation and causes connection failure.

Further, although it is not considered in PTL 1 as to how the lid plating is superimposed on the through-hole lands by the semi-additive method, a structure is proposed in which the lid plating is formed by the semi-additive method in such a manner that it covers the through hole lands as in PTL 2. In this structure, with respect to through holes that are formed with a certain positional accuracy, through hole lands are formed in sizes taking into consideration the alignment accuracy of the photolithography of the subtractive method and the wiring thinning by the etching of the same. Since the lid plating is further superimposed on top of them taking into consideration the wiring formation accuracy in the semi-additive method, the size of the lands finally formed is increased by the margin of each step, and this hinders formation of finer wiring.

The present invention has been made in view of the above circumstances, and an object thereof is to provide a wiring board, a multilayer wiring board, and a method of manufacturing a wiring board adapted to easily make the filling of the through holes (penetrating holes) and the formation of the wiring patterns compatible with each other.

Solution to Problem

In order to improve or even solve the above-mentioned problem, the inventors have conducted intensive study. That is, to approach the problem of an increase in the amount of undercut during wiring formation etching, which is one of the obstacles to narrowing the pitch of the through holes, in order to reduce the amount of undercut, a configuration was adopted in which the wiring formation etching is performed before lid plating, and the thickness of the through hole lands is reduced (the thickness T1 of the through hole lands 25 in FIG. 7B is made less than the thickness T11 of the through hole lands 125 in FIG. 6B). The relationship between the undercut amounts S1 and S2 shown in FIGS. 6A, 6B, 7A, and 7B is S1>S2. When the amount of undercut increases, the variation in diameter of the through hole lands also increases, but according to the configuration of the present invention, the undercut amount is reduced, and therefore the variation in diameter of the through hole lands can also be reduced. FIGS. 6 and 7 will be described in detail later.

Further, regarding the reduction of the diameter of the conductor patterns covering the periphery of the through holes, the inner/outer positional relationship of the through hole formation, the through hole land formation, and the lid plating conductor formation was carefully examined. Based on this examination, it has been found that by adopting a configuration in which the through hole lands, which have the largest variation in diameter, have the largest coverage, it is possible to achieve the reduction in diameter while suppressing decrease in the connection reliability due to misalignment.

That is, a wiring board according to one aspect of the present invention comprises: an insulator; a through hole penetrating between a front surface and a back surface of the insulator; a through hole conductor provided on a wall surface of the through hole to electrically connect a front surface side opening and a back surface side opening of the through hole; through hole lands provided around the front surface side opening and the back surface side opening, respectively, and connected to the through hole conductor; lid plating conductors provided on the front surface side and the back surface side of the insulator, respectively, and placed on the respective through hole lands; and wiring patterns formed on the front surface and the back surface of the insulator, respectively. The thickness of the through hole lands is 1.0 μm or more and 10.0 μm or less, and an area of each lid plating conductor is smaller than an area of each through hole land.

A multilayer wiring board according to another aspect of the present invention comprises the above-described wiring board, and an insulating layer and a conductor layer alternately laminated on at least one of the front surface and the back surface of the wiring board.

A method of manufacturing a wiring board according to another aspect of the present invention comprises: forming a through hole penetrating between a front surface and a back surface of an insulator; forming a through hole conductor on a wall surface of the through hole to electrically connect a front surface side opening and a rear surface side opening of the through hole; forming through hole lands around the front surface side opening and the back surface side opening of the insulator, respectively, such that the through hole lands are connected to the through hole conductor; and forming, by the semi-additive method and respectively on the front surface side and the back surface side of the insulator, lid plating conductors placed on the respective through hole lands and wiring patterns. A thickness of the through hole lands is 1.0 μm or more and 10.0 μm or less, and an area of each lid plating conductor is smaller than an area of each through hole land.

Advantageous Effect of the Invention

According to one aspect of the present invention, it is possible to easily make the filling of the through holes and the formation of the wiring patterns compatible with each other.

BRIEF DESCRIPTION OF THE DRAWINGS

FIGS. 2A, 2B, and 2C show the manufacturing process of the wiring board shown in FIG. 1, wherein FIG. 2A is a cross-sectional view showing the step of preparing a substrate with an insulator having a copper foil on each of the front surface and the back surface thereof, FIG. 2B is a cross-sectional view showing the step of forming a through hole at a desired position of the substrate, and FIG. 2C is a cross-sectional view showing the step of forming a conductor on the entire surface of the front and back surfaces of the substrate and the wall surface of the through hole.

FIGS. 3A, 3B, and 3C the manufacturing process of the wiring board shown in FIG. 1, wherein FIG. 3A is a cross-sectional view showing the step of filling a hole filling resin in the through hole following the step shown in FIG. 2C, FIG. 3B is a cross-sectional view showing the step of adjusting the thickness T1 of the surface layer conductors on the front surface side and the back surface side of the substrate to be 1.0 to 10 μm, and FIG. 3C is a cross-sectional view showing the step of forming an etching resist on each of the front surface side and the back surface side of the substrate.

FIGS. 4A, 4B, and 4C show a method of manufacturing the wiring board shown in FIG. 1, wherein FIG. 4A is a cross-sectional view showing the step of, subsequent to the step shown in FIG. 3C, etching (removing) the copper in the part of the surface layer conductor that is not covered with the etching resist for each of the front surface side and the back surface side of the substrate and also removing the etching resist to thereby form the through hole conductor and the through hole lands, FIG. 4B is a cross-sectional view showing the step of forming electrolytic copper plating on each of the front surface side and the back surface side of the substrate, and FIG. 4C is a cross-sectional view showing the step of forming a plating resist on each of the front surface side and the back surface side of the substrate.

FIGS. 5A and 5B show a method of manufacturing the wiring board shown in FIG. 1, wherein FIG. 5A is a cross-sectional view showing the step of, subsequent to the step shown in FIG. 4C, performing electrolytic copper plating on each of the front surface side and the back surface side of the substrate and removing the plating resist to thereby form the lid plating conductors and the wiring patterns, and FIG. 5B is a cross-sectional view showing the step of etching (removing) the part of the electrolytic copper plating that is exposed from the lid plating conductor and the wiring pattern for each of the front surface side and the back surface side of the substrate.

FIGS. 6A and 6B show the process of manufacturing a conventional wiring board, wherein FIG. 6A is a cross-sectional view showing the step of performing electrolytic copper plating for forming the lid plating conductors after adjusting the thickness of the surface layer conductors to a predetermined thickness on the front surface side and the back surface side of the substrate with the through hole filled with a hole filling resin, and further forming the etching resist, and FIG. 6B is a cross-sectional view showing the step of etching (removing) the copper in the parts of the electrolytic copper plating and the surface layer conductor on each of the front and back surface sides of the substrate that are not covered with the etching resist to thereby form the through hole lands and the lid plating conductors.

FIGS. 7A and 7B the manufacturing process of the wiring board shown in FIG. 1 in comparison with FIGS. 6A and 6B, wherein FIG. 7A is a cross-sectional view (a cross-sectional view similar to FIG. 3C) showing the step of forming the etching resist after adjusting the thickness of the surface layer conductors on the front surface side and the back surface side of the substrate with the through hole filled with a hole filling resin in the through hole to be 1.0 to 10 μm, and FIG. 7B is a cross-sectional view (a cross-sectional view of the state in which the etching resist is not removed in FIG. 4A) showing the step of etching (removing) the copper in the parts of the surface layer conductors on the front surface side and the back surface side of the substrate that are not covered with the etching resist to thereby form the through hole lands.

DESCRIPTION OF REPRESENTATIVE EMBODIMENTS

Figure 1:
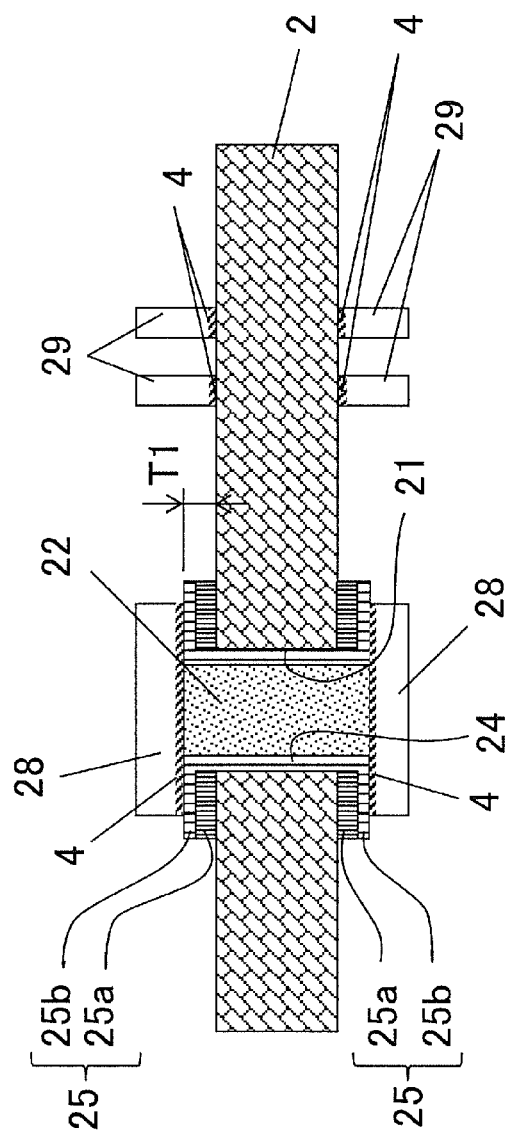
FIG. 1 is a partially cross-sectional view of a wiring board according to an embodiment of the present invention.

With reference to the drawings, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., are different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

A wiring board according to one embodiment of the present invention is shown in FIG. 1. The wiring board comprises an insulator 2 in the form of a flat plate, a through hole 21 penetrating between the front surface (the upper surface in FIG. 1) and back surface of the insulator 2, a through hole conductor 24 provided on the wall surface of the through hole 21 to electrically connect the front surface side opening and the back surface side opening of the through hole 21 with each other, through hole lands 25 provided around the front surface side opening and the back surface side opening, respectively, and connected to the through hole conductor 24, and lid plating conductors 28 provided on the front surface side and the back surface side of the insulator 2, respectively, and placed on the respective through hole lands 25.

Here, each through hole land 25 comprises a copper foil 25a formed on the front surface or the back surface of the insulator 2, and a copper conductor 25b formed on the copper foil 25a, and they are formed such that they extend from the through hole conductor 24 to the periphery of the front surface side opening or the back surface side opening of the through hole 21.

The thickness T1 of the through hole lands 25 is 1.0 μm or more and 10.0 μm or less. In addition, the area of the lid plating conductors 28 is smaller than the area of the through hole lands 25.

When the thickness T1 of the through hole lands 25 is 1.0 μm or more and 10.0 μm or less, it is possible to reduce the etching amount and the undercut amount of the subtractive method. Thus, the variation in the diameter of the through hole lands 25 can be suppressed and fine wiring can be formed. When the thickness T1 of the through hole lands 25 is less than 1.0 μm, the through hole lands 25 may be greatly damaged due to the etching in the subsequent process. On the other hand, when the thickness T1 of the through hole lands 25 is more than 10 μm, the effect of making the wiring finer provided by reducing the etching amount of the subtractive method is reduced. Further, by making the area of the lid plating conductors 28 smaller than the area of the through hole lands 25, it is possible to reduce the size of the conductor pattern covering the periphery of the through hole.

A hole filling resin (resin) 22 is filled inside the through hole 21, and the through hole conductor 24 is interposed between the hole filling resin 22 and the wall surface of the through hole 21.

A conductive wiring pattern 29 is formed on each of the front surface and the back surface of the insulator 2. The width of this wiring pattern 29 is 2.0 μm or more and 25 μm or less. Further, in each of the front surface and the back surface of the insulator 2, the conductor area ratio of the region, including the wiring pattern 29 and the gap part adjacent to the wiring pattern 29, and not including the through hole land 25, in each of the front surface and the back surface of the insulating material 2, that is, the conductor area ratio of the wiring pattern 29 in the region not including the through hole land 25 in the front surface and the back surface of the insulator 2 is 50% or less.

When the width of the wiring pattern 29 is less than 2.0 μm, the variation in size becomes large, and it is difficult to form the wiring pattern 29 with high accuracy. On the other hand, when the width of the wiring pattern 29 is more than 25 μm or the conductor area ratio of the wiring pattern 29 is more than 50%, the difference in the degree of current concentration between the lid plating conductor 28 and the wiring pattern 29 is small, and there tends to be only a small difference between the conductor thickness of the lid plating conductor 28 and the conductor thickness of the wiring pattern 29, which are undesirable.

Note that, in FIG. 1, the reference sign 4 denotes electrolytic copper plating, which is formed between the insulator 2 and the wiring pattern 29, and between the through hole land 25 and the lid plating conductor 28.

Next, a method for manufacturing the wiring substrate shown in FIG. 1 will be described with reference to FIGS. 2A, 2B, 2C, 3A, 3B, 3C, 4A, 4B, 4C, 5A, and 5B.

Figure 2A:
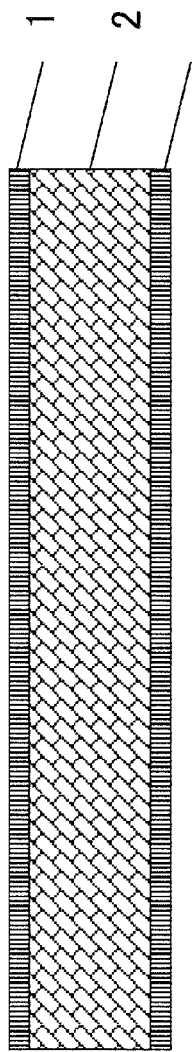

To manufacture the wiring substrate, first, as shown in FIG. 2A, a substrate on which a copper foil 1 is formed on each of the front surface and the back surface of the insulator 2 is prepared. This substrate can be formed by laminating the copper foil 1, the insulator 2 and the copper foil 1 in this order and subjecting it to thermocompression bonding treatment. The copper foil 1 is thinned down to be 0.1 to 6 μm by etching or the like. The copper foil 1 will serve as a copper foil 25a for forming the aforementioned through hole land 25 in a later step.

Figure 2B:
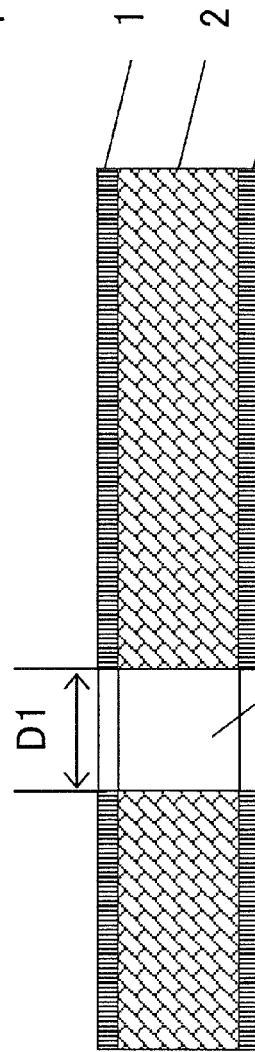

Next, as shown in FIG. 2B, the through hole 21 is formed at a desired position of the substrate by a mechanical drill. Due to the restriction on the size of the drill bit, the diameter D1 of the through hole 21 is about 75 μm to 300 μm.

Figure 2C:
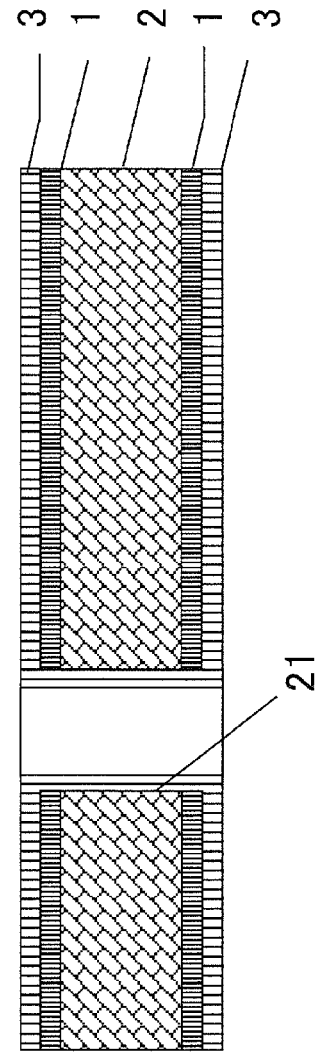

Subsequently, as shown in FIG. 2C, after performing electrolytic copper plating treatment on the entire surface of the front surface and the back surface of the substrate as well as the wall surface of the through hole 21 with a thickness of about 0.5 to 1.0 μm, a conductor 3 of thickness about 5 to 20 μm is formed on the entire surface of the front surface and the back surface of the substrate as well as the wall surface of the through hole 21 by electrolytic copper plating treatment. This conductor 3 electrically connects the front surface side opening and the back surface side opening of the through hole 21. The conductor 3 will later serve as a copper conductor 25b for forming the through hole conductor 24 and the through hole lands 25.

Figure 3A:
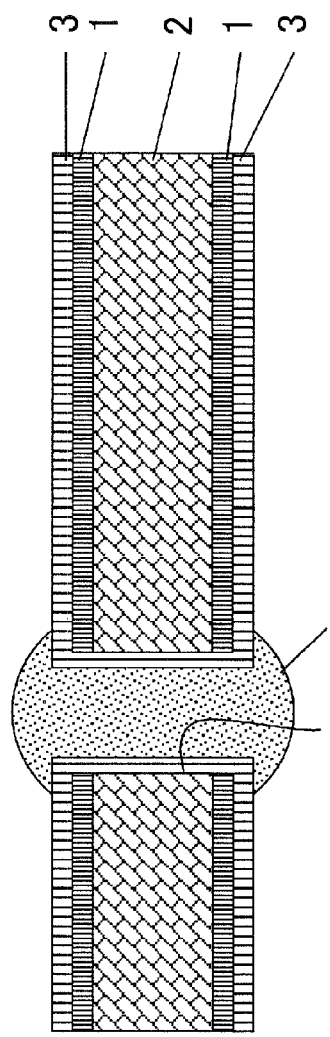

Next, as shown in FIG. 3A, the through hole 21 imparted with conductivity by the conductor 3 is filled with the hole filling resin 22 by screen printing or the like. When the hole filling resin 22 is cured after printing, the hole filling resin 22 shrinks due to curing shrinkage. Therefore, the hole filling resin 22 is printed so as to overhang 5 µm or more on the front surface side and the back surface side of the substrate, respectively.

Figure 3B:
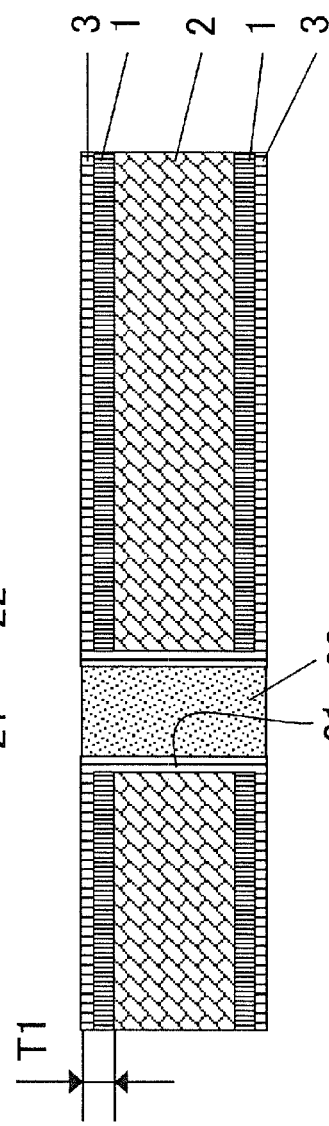

Next, physical polishing is performed on the front surface side and the back surface side of the substrate, respectively. As a result, as shown in FIG. 3B, the thickness T1 of the surface layer conductor (that is, the copper foil 1 and the conductor 3) on each of the front surface side and the back surface side of the substrate is set to 1.0 to 10 µm. This thickness T1 is the thickness T1 of the above-mentioned through hole lands 25, and when it is less than 1.0 µm, the through hole lands 25 may be greatly damaged due to the etching in the subsequent process. Further, when the thickness T1 is more than 10 µm, the effect of the present invention of making the wiring finer provided by reducing the etching amount of the subtractive method is reduced. In order to obtain the effect of the present invention, the thickness T1 is more preferably 4 µm to 8 µm.

Figure 3C:
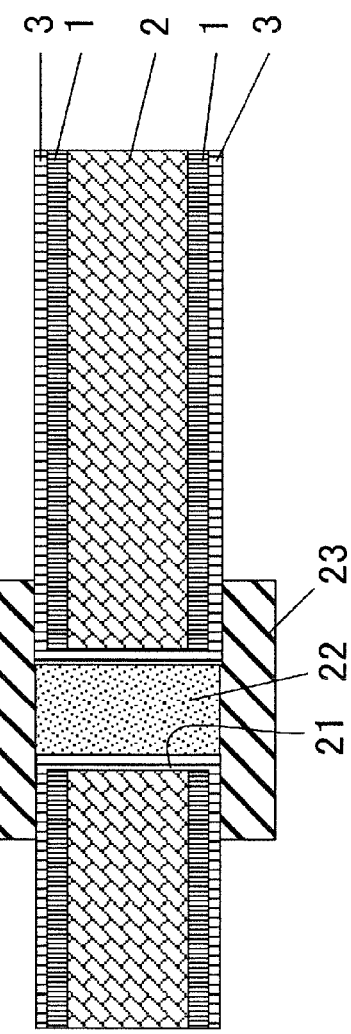

Next, as shown in FIG. 3C, an etching resist 23 is formed on each of the front surface side and the back surface side of the substrate so as to cover the through hole 21 and its surrounding area and expose the other area. The etching resist 23 is patterned by laminating a dry film with a laminator and then exposing and developing it.

Figure 4A:
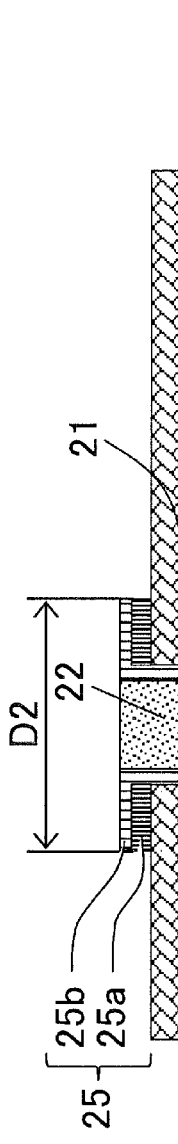

Subsequently, the copper of the part of the surface layer conductor (copper foil 1 and conductor 3) that is not covered with the etching resist 23 is removed by etching, and after that, the etching resist 23 is removed as shown in FIG. 4A, and the through hole conductor 24 and the through hole lands 25 are formed. Depending on the compatibility with the underlying resin, the etching solution can be selected from chemical solutions such as copper chloride, iron chloride, hydrogen peroxide/sulfuric acid, sodium persulfate, and the like. The diameter D2 of the through hole lands 25 should be more than the diameter (D1) of the through holes 21 shown in FIG. 3B by 70 µm or more.

Figure 4B:
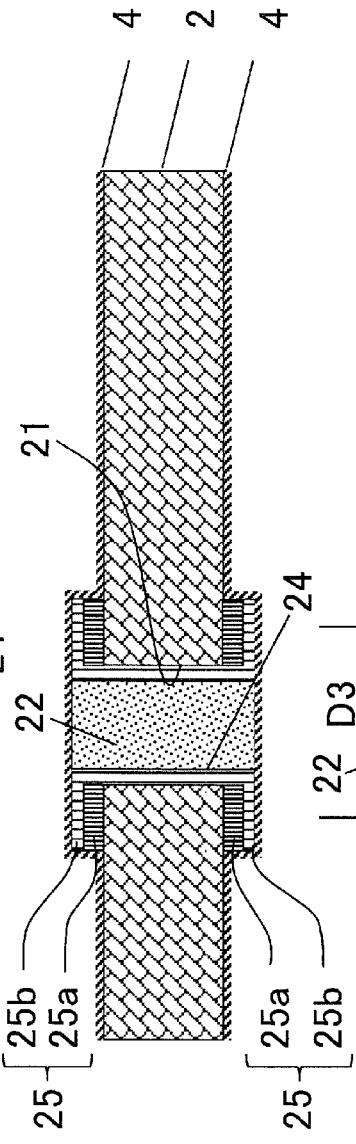

Next, as shown in FIG. 4B, on the front surface side and the back surface side of the substrate provided with the through hole conductor 24 and the through hole lands 25, electrolytic copper plating 4 is formed as an electrical power supply layer of the pattern plating performed later. The thickness of electrolytic copper plating 4 is sufficient if it is in the range of about 0.2 to 0.9 µm. If necessary, a primer resin that has good adhesion with the electrolytic copper plating 4 is provided on the front surface and the back surface of the insulator 2.

Figure 4C:
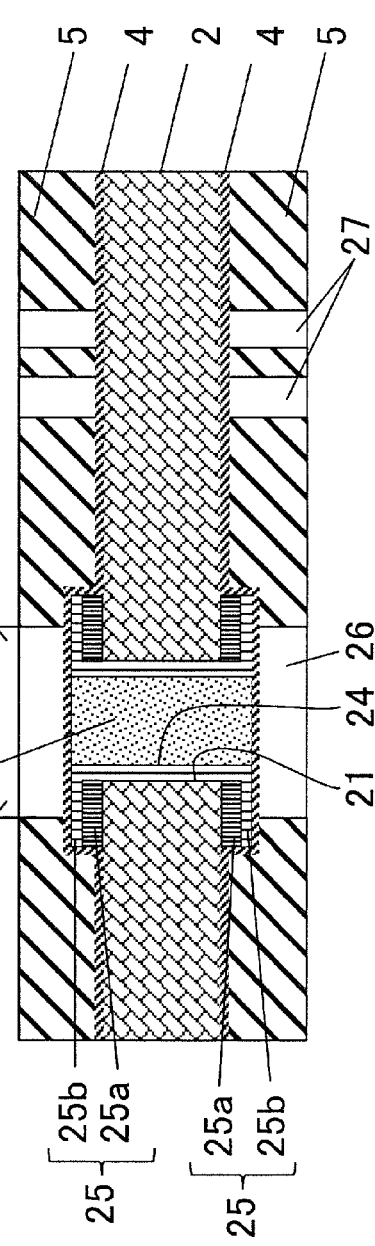

Next, as shown in FIG. 4C, a plating resist 5 is formed on each of the front surface side and the back surface side of the substrate. The plating resist 5 is used as a mask for the semi-additive method. In the semi-additive method, the area where the desired pattern is to be formed is exposed from below the plating resist 5, and the area other than the area where the desired pattern is to be formed is covered with the plating resist 5.

Resist openings 26 and 27 shown in FIG. 4C are openings formed in the plating resist 5. The resist openings 26 are areas where the lid plating conductors 28 are to be formed. The diameter D3 of the resist openings 26 is made smaller than the diameter of the through hole lands 25 (that is, the through hole land diameter D2) by about 30 µm. As a result, the lid plating conductors 28 can be formed without protruding from the through hole lands 25. Further, the resist openings 27 are areas where the wiring patterns 29 are to be formed.

Figure 5A:
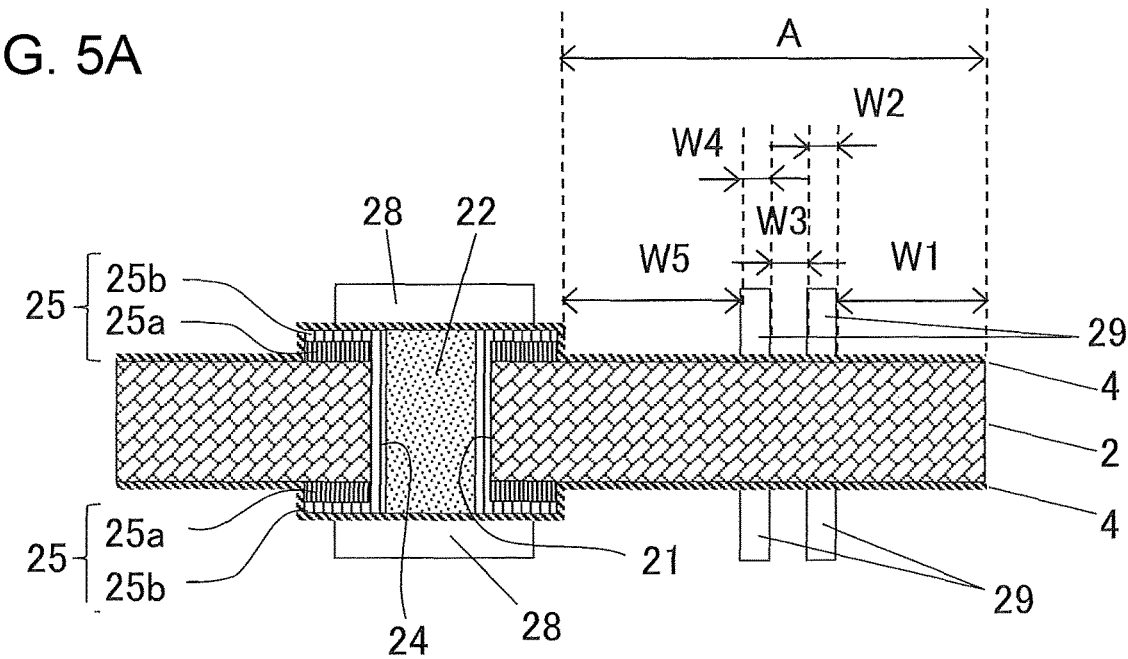

Next, electrolytic copper plating treatment is performed on the substrate on which the plating resist 5 is formed. As a result, the lid plating conductors and wiring patterns are formed inside the resist openings 26 and 27. The electrolytic copper plating formed inside the resist openings 26 corresponds to the lid plated conductors 28, and the electrolytic copper plating formed inside the resist openings 27 corresponds to the wiring patterns 29. After that, as shown in FIG. 5A, the plating resist is removed.

Figure 5B:
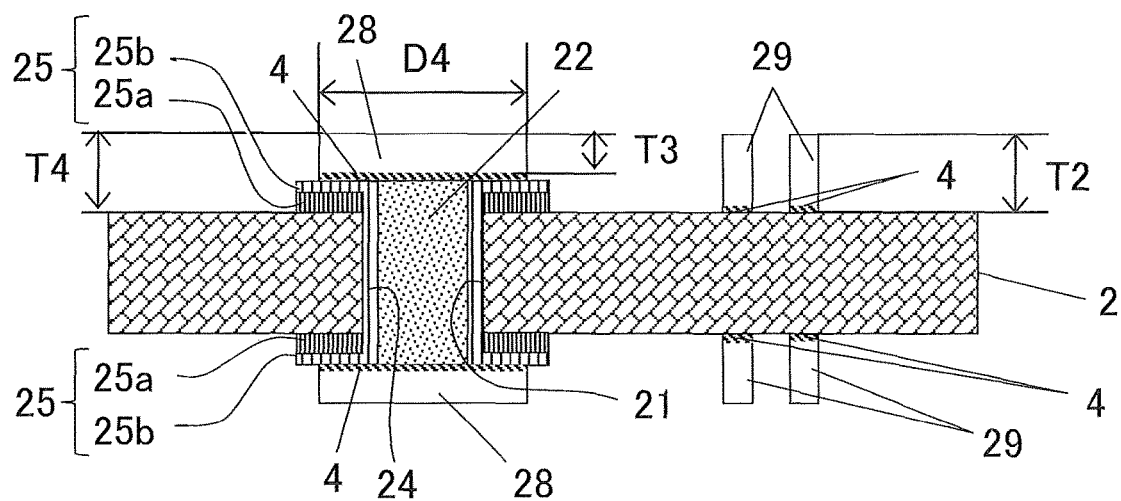

Then, as shown in FIG. 5B, the part of the electrolytic copper plating 4 exposed from under the lid plating conductors 28 and the wiring patterns 29 is removed by etching. Thus, the wiring board according to the embodiment of the present invention shown in FIG. 1 is completed.

In the case of forming a fine wiring pattern 29 whose dimension in the width direction is smaller than 20 µm using the semi-additive method, the current concentrates during electrolytic plating, and the thickness T2 of the wiring pattern 29 becomes thick. On the other hand, when a relatively large lid plating conductor 28 having a diameter exceeding 140 µm is formed, the current does not concentrate, and therefore the plating thickness T3 of the lid plating conductor 28 becomes relatively small. Generally, the difference between the thickness T2 of the wiring pattern 29 and the plating thickness T3 of the lid plating conductor 28 is determined by the characteristics of the plating bath, but by adjusting the thickness T1 of the through hole land 25, the height T4 of the conductor around the through hole can be adjusted.

That is, in the embodiment of the present invention, the through hole land 25 provided in advance has the thickness T1. Therefore, the conductor around the through hole can be formed with a thickness (that is, the thickness T4) that is the sum of the thickness T1 of the through hole land 25, the thickness of the electrolytic copper plating 4, and the plating thickness T3 of the lid plating conductor 28. Further, this is not limited to the area over the through hole 21, and, for example, by forming the etching resist 23 shown in FIG. 3C at a desired position in the ground conductor pattern, it is possible to increase the thickness of the conductor at that position by the thickness T1 of the through hole land 25.

After that, insulating layers and conductor layers are alternately laminated on at least one of the front surface and the back surface of the wiring substrate. In this lamination process, the steps of forming interlayer conductivity and circuit are repeated as appropriate. A multilayer wiring substrate (multilayer printed wiring board) is thus completed.

Advantageous Effects of the Embodiment

According to the embodiment of the present invention, since the conductor for forming the through hole land is thin (thickness T1), the etching amount for forming the through hole land is suppressed, and through holes can be formed with a narrower pitch than the related art.

This will be described with reference to FIGS. 6 and 7.

FIG. 6A shows the process of manufacturing a conventional wiring board. FIG. 6A shows, after adjusting the thickness of the surface layer conductors (the copper foil 101 and the copper conductor 103) on the front surface side and the back surface side of a substrate comprising an insulator 102 provided with a through hole 121 filled with a hole filling resin 122 to a certain thickness, performing a process of producing electrolytic copper plating 104 for forming lid plating conductors 128, and further forming an etching resist 123 Then, from the state shown in FIG. 6A, as shown in FIG. 6B, the copper in the parts of the electrolytic copper plating 104 and the surface layer conductor (the copper foil 101 and the copper conductor 103) on each of the front surface side and the back surface side of the substrate that is not covered with the etching resist 123 is removed by etching to form the through hole lands 125 and the lid plating conductors 128. In FIG. 6B, the reference sign 125a denotes the copper foil for forming the through hole lands 125, and the reference sign 125b denotes the copper conductor formed on the copper foil 125a.

Here, at the time the copper in the parts not covered with the etching resist 123 of the electrolytic copper plating 104 and the surface layer conductor (the copper foil 101 and the copper conductor 103) is removed by etching, the thickness of the copper part under the etching resist 123 is the thickness T11 which is obtained by adding the thickness of the through hole land 125 and the thickness of the lid plating conductor 128.

On the other hand, FIGS. 7A and 7B show a manufacturing process of the wiring board shown in FIG. 1 of the present embodiment in comparison with FIGS. 6A and 6B, and FIG. 7A shows, after adjusting the thickness of the surface layer conductor (the copper foil 1 and the copper conductor 3) on each of the front surface side and the back surface side of the substrate comprising a through hole 21 filled with a hole filling resin 22 to a thickness of 1.0 to 10 μm, forming an etching resist 23. Then, from the state shown in FIG. 7A, as shown in FIG. 7B, the copper in the part of the surface layer conductor (the copper foil 1 and the copper conductor 3) on each of the front surface side and the back surface side of the substrate that is not covered with the etching resist 23 is removed by etching to form the through hole lands 25.

Here, at the time the copper in the part not covered with the etching resist 23 of the surface layer conductor (the copper foil 1 and the copper conductor 3) is removed by etching, the thickness of the copper part under the etching resist 23 is the thickness T1 of the through hole land 25. The thickness T1 of the through hole land 25 is not only less than the thickness T11 which is the sum of the thickness of the conventional through hole land 125 and the thickness of the lid plating conductor 128, but it has a value of 1.0 to 10 μm, which is smaller than the thickness of the through hole land 125 itself.

Therefore, as can be seen by comparing FIG. 6B and FIG. 7B, the undercut amount S2 in this embodiment is smaller than the conventional undercut amount S1, and the etching amount for forming the through hole lands is reduced in this embodiment. Thus, through holes can be formed with a narrower pitch than in the related art.

Further, in the present embodiment, the lid plating conductors 28 and the wiring patterns 29 are formed by the semi-additive method. As a result, it is possible to form wiring patterns 29 that are finer (for example, the width of the wiring/gap is smaller than 30 μm) than the conventional ones.

Further, in the present embodiment, before forming the lid plating conductors 28 and the wiring patterns 29, surface layer conductors having a thickness T1 are formed in advance around the through holes 21. As a result, with respect to the wiring pattern 29, which tends to have an increased plating thickness due to the current concentration during plating, it is possible to increase the height (from the front surface or the back surface of the insulator 2) of the lid plating conductor 28, which tends to have a reduced thickness due to the small current concentration, as well as the height of the solid part. Therefore, it is possible to reduce the variation in height of the thickness T2 of the wiring pattern 29, the conductor thickness around the through hole 21, and the solid part.

Further, in the present embodiment, the through hole 21 imparted with conductivity by the conductor 3 is filled with the hole filling resin 22 by screen printing or the like. In this step, the hole filling resin 22 is printed so as to overhang 5 μm or more on the front surface side and the back surface side of the substrate, respectively. After that, the hole filling resin 22 is cured and polished. This polishing adjusts the height of the hole filling resin 22 and height of the conductor 3 to be the same. As a result, the through hole land 25 are not greatly recessed or protruded. Therefore, it is possible to reduce the incidence of via connection failure between the through hole land 25 and the build-up layer formed thereon.

According to the configuration described above, it is possible to easily make the filling of the through holes 21 and the formation of the fine wiring patterns 29 compatible with each other. As a result, it is possible to manufacture, as the finished product, a wiring board or a multilayer printed wiring board having high mountability and fine wiring with high yield.

Other Embodiments

The embodiment of the present invention described above is merely an example and does not limit the present invention. Therefore, the present invention can be modified without departing from the gist thereof.

For example, the through hole 21 may be formed by laser processing, or a conductive paste may be used as the filler for filling the through hole 21. Further, the etching resist 23 and the plating resist 5 may be in a liquid form and formed on the substrate by spin coating or roll coating. In addition, when the adhesion between the electrolytic copper plating 4 and the hole filling resin 22 in FIG. 4B is poor, resin roughening treatment may be performed on the entire surface of the substrate shown in FIG. 4A.

EXAMPLES

Examples

A wiring substrate was prepared by the following process.

A double-sided copper-clad laminate was used which comprises, as the insulator 2, a glass cloth impregnated with epoxy resin (thickness of the insulating layer: 800 μm, thickness of the copper foil with primer resin: 12 μm), and a hydrogen peroxide/sulfuric acid etching solution was applied to both of the sides to thin down the copper foil 1 to be 3 μm (FIG. 2A).

Next, a through hole 21 having a diameter of 105 μm was formed at a desired position of the substrate by a mechanical drill (FIG. 2B).

Subsequently, after performing desmear treatment in the through hole 21 with an aqueous solution containing sodium permanganate, a copper thin film (conductor 3) with a thickness of 0.5 μm was formed over the entire surface of the substrate by electrolytic copper plating, and electrolytic copper plating was carried out to produce a thickness of 10 μm using a bath with good throwing power for through hole plating (FIG. 2C).

Further, an insulating resin (hole filling resin 22) dedicated for hole filling was filled in the through hole 21 with a screen printing machine (FIG. 3A), and both surfaces were polished evenly with a belt sander so that the conductor thickness (T1) becomes 3 μm (FIG. 3B).

Then, on each side of the substrate, a dry film resist with a thickness of 15 μm was laminated as the etching resist 23 with a hot roll laminator, and pattern exposure was carried out using a glass mask and a contact exposure machine (with manufacturer-recommended exposure amount).

Subsequently, development using a conveyor/sprayer device (treatment time: 2.5 times the breakpoint) (FIG. 3C), spray etching (just etching) using cupric chloride, and resist peeling with a spray (treatment time: 4 times the lifting point) were carried out in an integrated line to thereby form the through hole lands 25 as shown in FIG. 4A.

An aqueous solution of sodium permanganate was applied to the entire surface of the substrate to roughen the surface of the hole filling resin 22. Then, electrolytic copper plating for the semi-additive method was carried out for 20 minutes to form electrolytic copper plating 4 having a thickness of 1.0 μm (FIG. 4B).

A dry film (with a thickness of 25 μm and high resolution) was pasted by a hot roll laminator as the plating resist 5. Exposure was carried out by a stepper exposure machine (with a manufacturer-recommended exposure amount) and development was carried out by a conveyor/sprayer device (treatment time: 2.5 times the breakpoint) (FIG. 4C).

Next, pattern plating was carried out using an electrolytic copper plating device for pattern plating, and peeling was performed using a spray device (amine peeling liquid; treatment time: 4 times the lifting point) to form lid plating conductors 28 and wiring patterns 29 (FIG. 5A).

Subsequently, the electrolytic copper plating 4 of the electrical power supply layer was removed with a hydrogen peroxide/sulfuric acid etching solution (FIG. 5B).

In the wiring board formed by the above method, it was able to form the wiring pattern 29 (see FIG. 5B) laid independently in a wide space as designed with wiring/gap=10/10 μm. In addition, the lid plating conductor 28 (see FIG. 5B) was formed as designed with a diameter of 180 μm. The height of the wiring pattern 29 (i.e., the sum of the thickness of the electrolytic copper plating 4 and the thickness T2 of the wiring pattern 29) was 18 μm, and the sum T4 of the height of the through hole land 25 and the height of the lid plating conductor 28 was 19 μm.

Regarding the thickness T2 of the wiring pattern 29 in a part where the copper area ratio is less than 50% as seen locally as 1 mm square, and the thickness T3 of the lid plating conductor 28 having a large area, if they are formed to be 15 μm using an electrolytic copper plating device for ordinary via fill/pattern plating, the thickness T2 of the wiring pattern 29 will be greater by about 3 to 4 μm than the thickness T3 of the lid plating conductor 28. However, in the present example, by adding the thickness T1 of the through hole land 25 of 4 μm in total to the through hole part, the height T4 of the lid plating conductor 28 can be closer to the height of the wiring pattern 29 (that is, the sum of the thickness of the electrolytic copper plating 4 and the thickness T2 of the wiring pattern 29).

Thus, a core layer (wiring board) of a multilayer printed wiring board provided with the through hole 21 and the fine wiring pattern 29, and having high flatness as the base of the build-up layer was manufactured.

Comparative Example 1

Regarding the thickness T1 of the through hole lands 25, it is possible to polish it to below 1.0 μm, but since this will eliminate the effect of controlling the thickness T4, which is the effect of the embodiment of the present invention, it was impossible to adopt this.

Comparative Example 2

Further, when the thickness T1 of the through hole lands 25 exceeds 10 μm, the pattern may damage the surface of the roll at the time of forming the plating resist, and also, the thickness T4 may exceed 25 μm during pattern plating, and the resolution of the plating resist may be deteriorated. Therefore, it was unsuitable for practical use of the present invention.

Comparative Example 3

In addition, the design in which the diameter D2 of the through hole lands 25<the diameter D3 of the resist openings 26 is not recommended because it deviates from the gist of the present invention that the through hole pitch can be narrowed. Further, during plating in the semi-additive method, if there is not enough space between the plating resist 5 and the through hole land 25, the problem may occur that a very narrow gap is generated and a plating conductor is not formed due to insufficient replacement of the plating solution, and hence it cannot be adopted in the present invention.

Comparative Example 4

Further, regarding FIG. 5A, the design in which the width W2 or W4 of the wiring pattern 29 is larger than 25 μm, and the design in which the conductor area ratio of the wiring pattern 29 formed by only the semi-additive method, for example, the percentage of (W2+W4)/(W1+W2+W3+W4+W5) shown in FIG. 5A is greater than 50% are not recommended for the present invention because the difference in the degree of current concentration between the lid plating conductor 28 and the wiring pattern 29 is small and there will be no difference in the conductor thickness.

Conclusion

The Example have been compared with the Comparative Examples 1 to 4, and it has been found that the thickness T1 (the thickness of the through hole lands 25) of the surface layer conductor after polishing needs to be 1.0 μm or more and 10 μm or less.

Further, it has been found that, in the case where the lid plating conductor 28 is formed by the semi-additive method, the diameter D4 of the lid plating conductors 28 is required to be less than the diameter D2 of the through hole lands 25 (D2>D4).

In addition, it has been found that the widths W2 and W4 of the wiring pattern 29 need to be 25 μm or less. Note that W2 and W4 are preferably 2.0 μm or greater because when W2 or W4 is less than 2.0 μm, the variation in size becomes large and formation with high accuracy becomes difficult to achieve.

Further, for example, in the region A shown in FIG. 5A, it has been found that the conductor area ratio needs to be 50% or smaller. Note that the region A is a region that includes the wiring patterns 29 and the gap parts adjacent thereto and does not include the lid plating conductor 28. The gap parts include the gap between the wiring patterns 29 adjacent to each other as viewed in cross section and the gap between the wiring pattern 29 and the lid plated conductor 28 adjacent to each other.

REFERENCE SIGNS LIST

1 . . . Copper foil; 2 . . . Insulator; 3 . . . Conductor; 4 . . . Electrolytic copper plating; 5 . . . Plating resist; 21 . . . Through hole; 22 . . . Hole filling resin; 23 . . . Etching resist; 24 . . . Through hole conductor; 25 . . . Through hole land; 25*a* . . . Copper foil 25*b* . . . Conductor; 26 . . . Resist opening; 27 . . . Resist opening; 28 . . . Lid plating conductor (formed by semi-additive method); 29 . . . Wiring pattern (formed by semi-additive method); 101 . . . Copper foil; 102 . . . Insulator; 103 . . . Conductor; 104 . . . Electrolytic copper plating; 121 . . . Through hole; 122 . . . Hole filling resin; 123 . . . Etching resist; 124 . . . Through hole conductor; 125 . . . Through hole land; 125*a* . . . Copper foil; 125*b* . . . Conductor; 128 . . . Lid plating conductor; A . . . Region (region including wiring pattern and gap part and not including lid plating conductor); D1 . . . Diameter of through hole; D2 . . . Diameter of through hole land; D3 . . . Diameter of resist opening; D4 . . . Diameter of lid plating conductor; S1 . . . Undercut amount of conventional method; S2 . . . Undercut amount of present invention; T1 . . . Thickness of through hole land (thickness of surface layer conductor (copper foil 1 and conductor 3) after polishing); T2 . . . Thickness of wiring pattern; T3 . . . Thickness of lid plating conductor; T4 . . . Height of lid plating conductor (sum of T1, thickness of electrolytic copper plating 4, and T3); T11 . . . Sum of thickness of through hole land and thickness of lid plating conductor; W1, W3, W5 . . . Width of gap part; W2, W4 . . . Width of wiring pattern.

What is claimed is:

1. A wiring board comprising:
   an insulator;
   a through hole penetrating between a front surface and a back surface of the insulator;
   a through hole conductor provided on a wall surface of the through hole to electrically connect a front surface side opening and a back surface side opening of the through hole;
   through hole lands provided around the front surface side opening and the back surface side opening, respectively, and connected to the through hole conductor;
   lids provided on the front surface side and the back surface side of the insulator, respectively, and placed on the respective through hole lands; and,
   wiring patterns formed on the front surface and the back surface of the insulator, respectively;
   wherein a thickness of the through hole lands is 1.0 µm or more and 8 µm or less, an area of each of the lids is less than an area of each through hole land, each of the lids and the wiring patterns comprises a plating conductor, which is the same for each of the lids and the wiring patterns, and wherein each of the lids and the wiring patterns are formed in a single step of depositing said plating conductor.

2. The wiring board of claim 1, further comprising a resin filled in the through hole, and,
   wherein the through hole conductor is interposed between the resin and the wall surface of the through hole.

3. The wiring board of claim 1, wherein
   a width of the wiring patterns is 2.0 pun or more and 25 µm or less, and
   a conductor area ratio of a region including the wiring pattern and a gap part adjacent to the wiring pattern and not including the through hole land in each of the front surface and the back surface of the insulator is 50% or smaller.

4. A multilayer wiring board comprising:
   the wiring board of claim 1; and
   an insulating layer and a conductor layer alternately laminated on at least one of the front surface and the back surface of the wiring board.

5. The wiring board of claim 1, wherein the thickness of the through hole lands is 4 µm to 8 µm.

6. A method of manufacturing a wiring board, comprising the steps of:
   forming a through hole penetrating between a front surface and a back surface of an insulator;
   forming a through hole conductor on a wall surface of the through hole to electrically connect a front surface side opening and a rear surface side opening of the through hole;
   forming through hole lands around the front surface side opening and the back surface side opening of the insulator, respectively, such that the through hole lands are connected to the through hole conductor; and
   forming, by depositing a plating conductor on the front surface side and the back surface side of the insulator, (a) lids placed on the respective through hole lands and (b) wiring patterns, wherein the each of the lids and the wiring patterns comprises the deposited playing conductor, and
   wherein a thickness of the through hole lands is 1.0 µm or more and 8.0 µm or less, and an area of each of the lids is less than an area of each through hole land.

7. The method of claim 6, wherein the thickness of the through hole lands is 4 µm to 8 µm.

* * * * *